(12) United States Patent
Wang et al.

(10) Patent No.: US 8,216,891 B2
(45) Date of Patent: Jul. 10, 2012

(54) LCD TFT ARRAY PLATE AND FABRICATING METHOD THEREOF

(75) Inventors: Yeong-Feng Wang, Hsin-Chu (TW); Liang-Bin Yu, Hsin-Chu (TW); Chih-Jui Pan, Hsin-Chu (TW); Chun-Hao Tung, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 77 days.

(21) Appl. No.: 12/923,551

(22) Filed: Sep. 28, 2010

(65) Prior Publication Data

US 2011/0014738 A1    Jan. 20, 2011

Related U.S. Application Data

(63) Continuation of application No. 11/907,470, filed on Oct. 12, 2007, now Pat. No. 7,871,868.

(30) Foreign Application Priority Data

Oct. 14, 2006  (TW) ............................... 95137965 A
Oct. 11, 2007  (TW) ............................... 96138014 A

(51) Int. Cl.
*H01L 21/00*   (2006.01)
*H01L 21/84*   (2006.01)

(52) U.S. Cl. ........ 438/155; 438/30; 438/151; 257/E21.7
(58) Field of Classification Search .................. 438/155; 257/E21.7

See application file for complete search history.

(56) References Cited

U.S. PATENT DOCUMENTS

| | | | |
|---|---|---|---|
| 5,317,432 A * | 5/1994 | Ino | ................................. 349/39 |
| 5,670,398 A | 9/1997 | Yin et al. | |
| 5,742,365 A | 4/1998 | Seo | |
| 6,392,733 B1 | 5/2002 | Gregory | |
| 6,556,257 B2 | 4/2003 | Ino | |
| 6,815,720 B2 | 11/2004 | Kobayashi et al. | |
| 7,205,571 B2 | 4/2007 | Ahn et al. | |
| 7,217,586 B2 | 5/2007 | Lee et al. | |
| 7,924,356 B2 * | 4/2011 | Kamijima et al. | .............. 349/43 |
| 2005/0077524 A1 | 4/2005 | Ahn et al. | |
| 2005/0263768 A1 | 12/2005 | Ahn | |
| 2006/0003479 A1 | 1/2006 | Park et al. | |
| 2007/0032036 A1 | 2/2007 | Wang et al. | |
| 2007/0166894 A1 | 7/2007 | Lim | |

FOREIGN PATENT DOCUMENTS

| | | |
|---|---|---|
| CN | 1040381 C | 10/1998 |
| CN | 1610110 A | 4/2005 |
| JP | 62-190762 A | 8/1987 |
| JP | 5034709 A | 2/1993 |
| JP | 05-173184 A | 7/1993 |
| JP | 2002-139743 A | 5/2002 |
| JP | 2003-066864 A | 3/2003 |
| JP | 2004-177946 A | 6/2004 |
| JP | 2004-334214 A | 11/2004 |
| KR | 2004-0106771 A | 12/2004 |

* cited by examiner

*Primary Examiner* — Daniel Whalen
(74) *Attorney, Agent, or Firm* — Rabin & Berdo, P.C.

(57) ABSTRACT

Lift-off method and half-tone photolithography are used to fabricate LCD TFT array plate. Only two photo masks are used to respectively define a first and a second metal layers to accomplish the LCD TFT array plate.

8 Claims, 10 Drawing Sheets

LCD TFT ARRAY PLATE AND FABRICATING METHOD THEREOF

RELATED APPLICATIONS

This application is a continuation application of application Ser. No. 11/907,470, filed on Oct. 12, 2007, the entirety of which is incorporated herein by reference.

BACKGROUND

1. Field of Invention

The present invention relates to a liquid crystal display (LCD) and a fabrication method thereof. More particularly, the present invention relates to a thin film transistor (TFT) array plate and a fabrication method thereof.

2. Description of Related Art

Liquid crystal displays (LCDs) have many advantages over other conventional displays, including high picture quality, small volume occupation, light weight, low voltage drive and low power consumption. Hence, LCDs are widely used in small portable televisions, mobile telephones, video recording units, notebook computers, desktop monitors, projector televisions and so on. The LCD is gradually replacing the conventional cathode ray tube (CRT) as a mainstream display unit.

The TFT array processes of LCDs mainly include deposition, photolithography and etching. Photolithography cost is the highest among all these processes. Hence, how to reduce the number of photolithography processes, i.e. reduce the number of required photo masks, is the key factor for reducing LCD production cost.

SUMMARY

The present invention provides several LCD TFT array plates and fabricating methods thereof. These LCD TFT array plates can be fabricated by only two photo masks, thereby reducing manufacturing cost and increasing throughput.

According to an embodiment of this invention, a method for fabricating a TFT array plate for use in an LCD is provided. A transparent conductive layer is formed on a substrate. The transparent conductive layer and the substrate are then patterned to form at least one scanning trench and at least one capacitive trench arranged alternately in parallel. The scanning trench has at least one TFT area, a scanning area, and a first terminal area; the capacitive trench has at least one capacitive area and a second terminal area. A first metal layer, a dielectric layer, a silicon layer, and a doped silicon layer are formed both in the scanning trench and the capacitive trench. A second metal layer is formed on the doped silicon layer and the transparent conductive layer. A TFT structure in the TFT area, a storage capacitor and a data line in the capacitive area, and two terminal structures in the first and the second terminal areas are simultaneously defined by photolithography and etching process with a single exposure step.

According to another embodiment of this invention, a method for fabricating a TFT array plate for use in an LCD is provided. A transparent conductive layer and a sacrificial layer are sequentially formed on a substrate. The sacrificial layer, the transparent conductive layer and the substrate are patterned to form at least one scanning trench and a capacitive trench arranged alternately in parallel. The scanning trench has at least one TFT area, a scanning area, and at least one first terminal area. The capacitive trench has at least one capacitive area and at least one second terminal area. The depths of the first and the second terminal areas are gradually decreased to zero toward the end of the scanning trench and the capacitive trench. A first metal layer, a dielectric layer, a silicon layer and a doped silicon layer are sequentially formed in the scanning trench and the capacitive trench as well as on the substrate surrounding the first and the second terminals, wherein the material of the dielectric layer is the same as that of the sacrificial layer. The exposed sidewalls of the sacrificial layer and the dielectric layer are laterally etched to draw back the sidewall profile of the sacrificial layer and the dielectric layer. A second metal layer is formed on the sacrificial layer, the transparent layer, and the doped silicon layer. A TFT structure in the TFT area, upper electrodes of storage capacitors and a data line in the capacitive area, and two terminal structures in the first and the second terminal areas are simultaneously defined by a photolithography and an etching is process with a single exposure step. A protective layer is formed on the exposed layers. The sacrificial layer, the dielectric layer which have exposed sidewalls and layers thereon are removed together.

According to another embodiment of this invention, a method of fabricating an LCD TFT array plate is provided. A transparent conductive layer is formed on a substrate. The transparent conductive layer and the substrate are patterned to form at least one scanning trench and at least one capacitive trench arranged alternately in parallel. The scanning trench has at least one TFT area, a scanning area and at least one first terminal area, and the capacitive trench has at least one capacitive area and at least one second terminal area. A first metal layer, a dielectric layer, a silicon layer and a protective layer are sequentially formed in the scanning trench and the capacitive trench. Photolithography and etching process with one exposure step is used to remove the protective layer to define two source/drain areas in the TFT area and an upper electrode area and a data line area in the capacitive area and to remove the protective layer and the silicon layer to expose the first metal layer in the first and the second terminal areas. A doped silicon layer and a second metal layer are sequentially formed on the source/drain areas, the upper electrode areas, the data line area, the first and the second terminal areas and residual photoresist. The exposed sidewalls of the transparent conductive layer are laterally etched to withdraw the lateral profile of to the transparent conductive layer. The residual photoresist is removed.

Accordingly, since the whole TFT array process can be accomplished by using only two photo masks, it is helpful to reduce production cost and increase throughput.

It is to be understood that both the foregoing general description and the is following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings where.

DETAILED DESCRIPTION

Reference will now be made in detail to the present embodiments of the invention, examples of which are illustrated in the accompanying drawings.

Embodiment 1

FIGS. 1A-1D are cross-sectional diagrams showing a process for fabricating an LCD TFT array plate according to an embodiment of this invention.

Figure 1A:
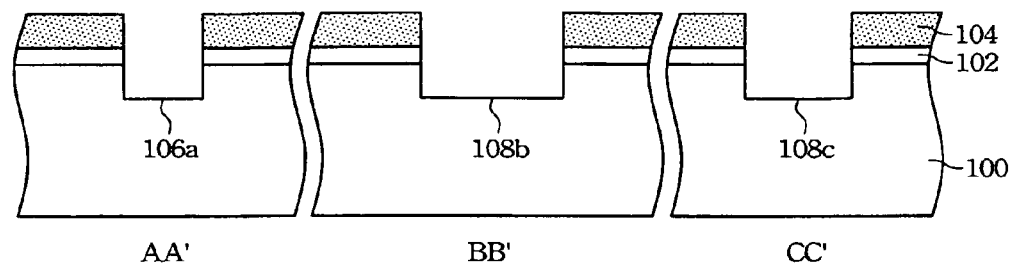
FIGS. 1A-1D are cross-sectional diagrams showing a process for fabricating a TFT array plate for use in an LCD, according to an embodiment of this invention.
Figure 2A:
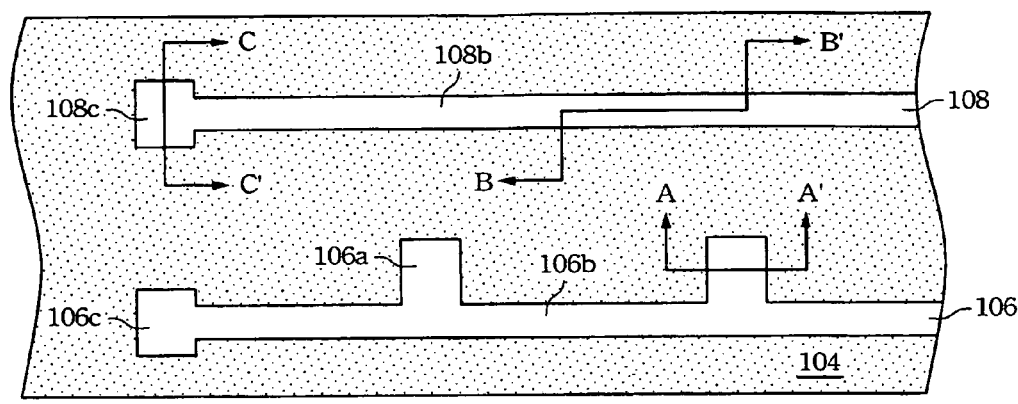
FIG. 2A is a plan view of FIG. 1A.

FIG. 2A is a plan view of FIG. 1A. In FIGS. 1A and 2A, a transparent conductive layer 102 and a first photoresist layer 104 are sequentially formed on the substrate 100. A first photo mask is then used to perform photolithography and etching processes to simultaneously form a scanning trench 106 and a capacitive trench 108. The surface of the substrate 100 outside the scanning trench 106 and the capacitive trench 108 is still sequentially covered by the transparent conductive layer 102 and the first photoresist 104. The substrate 100 is, for example, a glass substrate or a plastic substrate.

In FIG. 2A, the scanning trench 106 has three areas, a TFT area 106a (the section A-A' in FIG. 1A), a scanning area 106b, and a terminal area 106c. The capacitive trench 108 has two areas, a capacitive area 108b (section B-B' in FIG. 1A) and terminal area 108c (section C-C' in FIG. 1A). Since the structures of the terminal areas 106c and 108c are the same, the terminal areas 106c and 108c are not differentiated in the following descriptions.

Figure 1B:
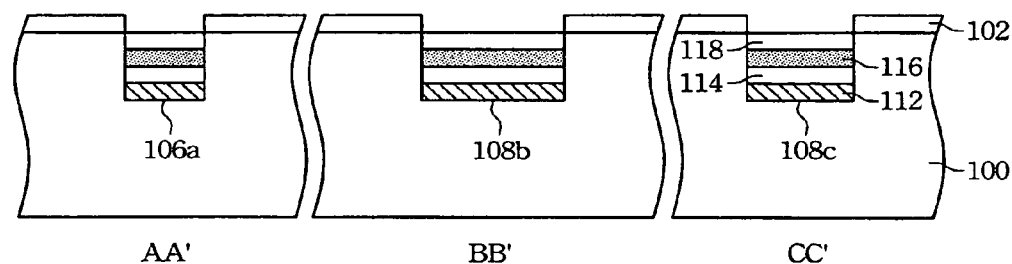

Referring to FIGS. 1B and 2A, a first metal layer 112, a dielectric layer 114, a silicon layer 116 (such as an amorphous silicon layer), and a doped silicon layer 118 (such as a doped amorphous silicon layer) are sequentially deposited in the scanning trench 106, the capacitive trench 108 and on the first photoresist layer 104. Then, a proper solvent is used to stripe the first photoresist layer 104 and layers thereon, i.e. the first metal layer 112, the dielectric layer 114, the silicon layer 116, and the doped silicon layer 118. Hence, only the first metal layer 112, the dielectric layer 114, the silicon layer 116, and the doped silicon layer 118 in the scanning trench 106 and the capacitive trench 108 are remained.

The first metal layer 112, the dielectric layer 114 and the silicon layer 116 in the TFT area 106a of the scanning trench 106 are to be a gate, a gate dielectric layer and a channel region of a thin film transistor (TFT), respectively. The first metal layer 112 in the capacitive area 108b of the capacitive trench 108 is served as both a capacitive line and a bottom electrode of a storage capacitor.

Figure 1C:
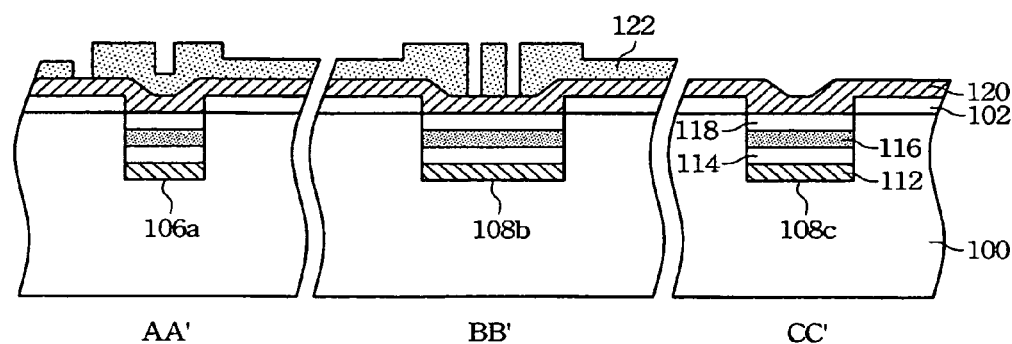

In FIG. 1C, a second metal layer 120 and a second photoresist layer 122 are sequentially formed on the substrate 100. Then, a single photolithography process is performed to pattern the second photoresist layer 122 by, for example, a halftone photo mask. The second photoresist layer 122 on a pixel area and a channel area of the TFT area 106a is partially exposed to leave the second photoresist layer 122 having partial thickness. The second photoresist layer 122 on source/drain areas of the TFT area 106a, the storage capacitor area and the data line area in the capacitive area 108b are not exposed at all, and the second photoresist layer 122 remains intact in these areas. The second photoresist layer 122 on the other areas is fully exposed, and therefore removed in the development step of the photolithography process.

Figure 1D:
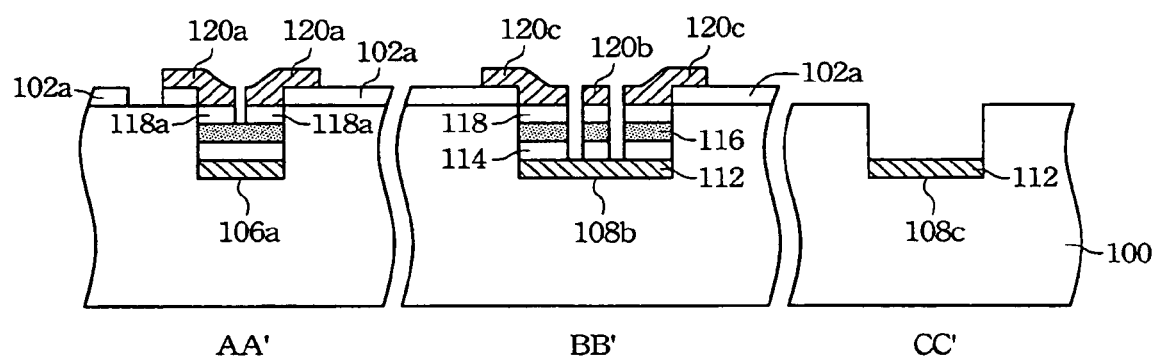
Figure 2B:
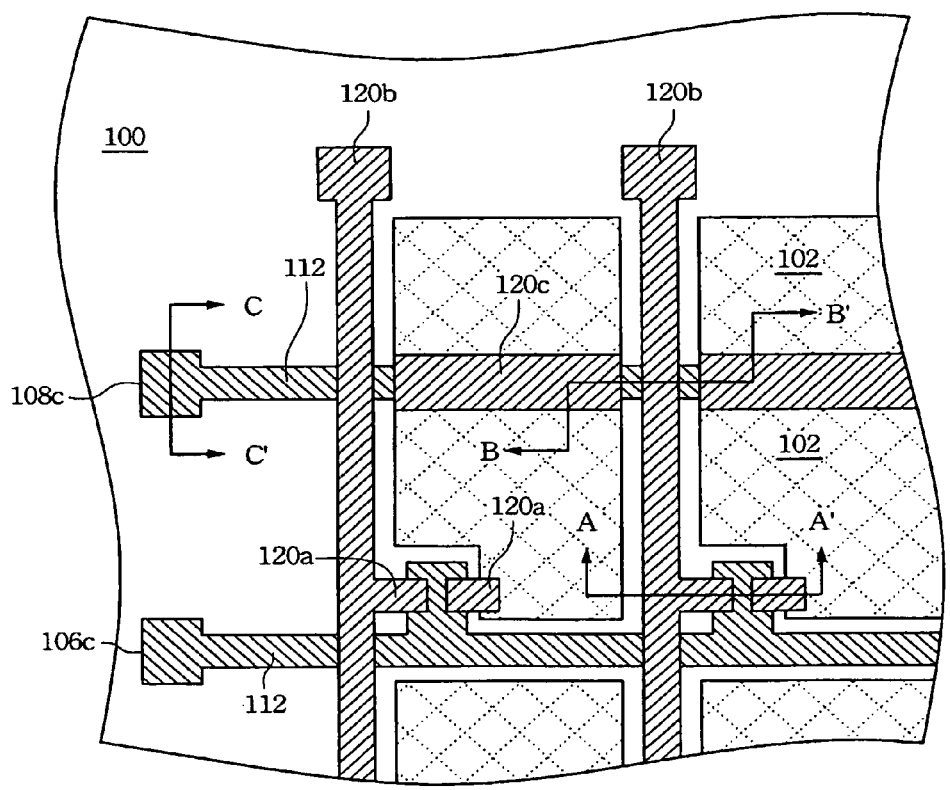
FIG. 2B is a plan view of FIG. 1D.

FIG. 2B is a plan view of FIG. 1D. An anisotropic etching process is performed to etch downwardly. Since the thickness of the second photoresist layer 122 is varied on different areas, and the etch depth is hence varied on different areas.

In section A-A' of FIG. 1D, the second photoresist layer 122 with reduced thickness on the TFF area 106a is continuously etched till the silicon layer 116 is exposed. The second metal layer 120 and the doped silicon layer 118 are simultaneously defined to form source/drains 120a and an underlying ohm contact layers 118a. In the peripheral region surrounding the TFT area 106a, only the second metal layer 120 is removed in the area covered by the second photoresist layer 122. But both the second metal layer 120 and the transparent conductive layer 102 are removed in the area without being covered by the second photoresist layer 122, in order to define pixel electrode 102a. The source/drains 120a electrically connect the pixel electrode 102a by a way of, for example, direct contact, as shown in FIG. 1D.

In section B-B' of FIG. 1D, on the exposed capacitive area 108b, the etching is proceeded till the first metal layer 112 is exposed. On the areas covered by the second photoresist 122 with reduced thickness and surrounding the capacitive area 108b, only the second metal layer 120 is removed. Hence, a data line 120b and upper electrodes 120c of the storage capacitor is simultaneously defined by defining the second metal layer 120.

In the section C-C' of FIG. 1D, on the exposed terminal area 108c, the etching process is proceeded till the first metal layer 112 is exposed. On exposed areas surrounding the terminal area 108c, the second metal layer 120 and the transparent conductive layer 102 are both removed to expose the substrate 100.

Finally, the residual second photoresist layer 122 is removed to accomplish the TFT array process.

In the embodiment 1, a first photo mask is used to form the scanning trench and the capacitive trench in the transparent conductive layer and the substrate. Hence, the TFT areas and the terminal areas related to the scanning line and the storage capacitor areas and the terminal areas related to the capacitive line can be preliminarily defined. After depositing the various required material layers, a second photo mask, such as a half-tone photo mask, is used to define the needed TFT structure, the upper electrode of the storage capacitor, and the data line structure, respectively. The source/drains electrically connect the pixel electrode by a way of, for example, direct contact. Therefore, only two photo masks are required to accomplish the whole TFT array process.

Embodiment 2

FIGS. 3A-3G are cross-sectional diagrams showing a process for fabricating an LCD TFT array plate according to another embodiment of this invention.

Figure 3A:
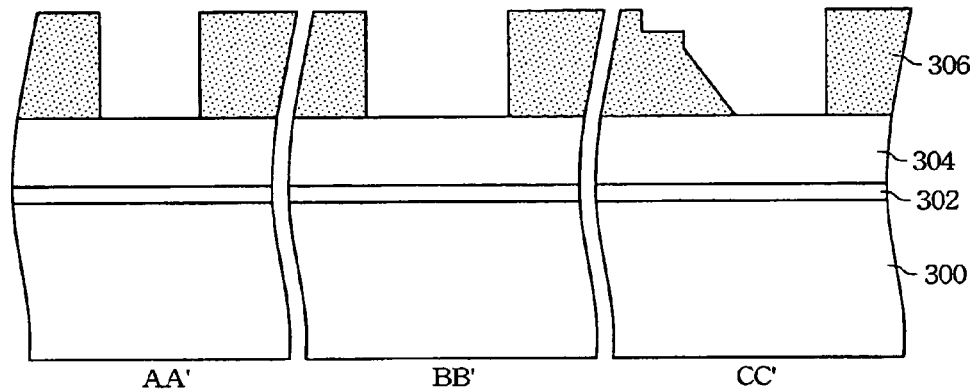
FIGS. 3A-3G are cross-sectional diagrams showing a process for fabricating a TFT array plate for use in an LCD, according to another embodiment of this invention.

In FIG. 3A, a transparent conductive layer 302, a sacrificial layer 304, and a first photoresist layer 306 are sequentially formed on a substrate 300. A photolithography process is performed to pattern the first photoresist layer 306 by, for example, a halftone photo mask. On a TFT gate area in section A-A' and a capacitive area in sections B-B' and C-C', the first photoresist layer 306 is fully exposed and the thickness of the first photoresist layer 306 on these areas are hence zero after a developing step. On terminal areas of a scanning line and a capacitive line, the exposure is gradually decreased toward the outer end of the scanning line and the capacitive line to gradually decrease the thickness of the first photoresist layer 306. The first photoresist layer 306 on the other area is not exposed at all and hence remains intact. The substrate 300 is, for example, a glass substrate or a plastic substrate.

Figure 3B:
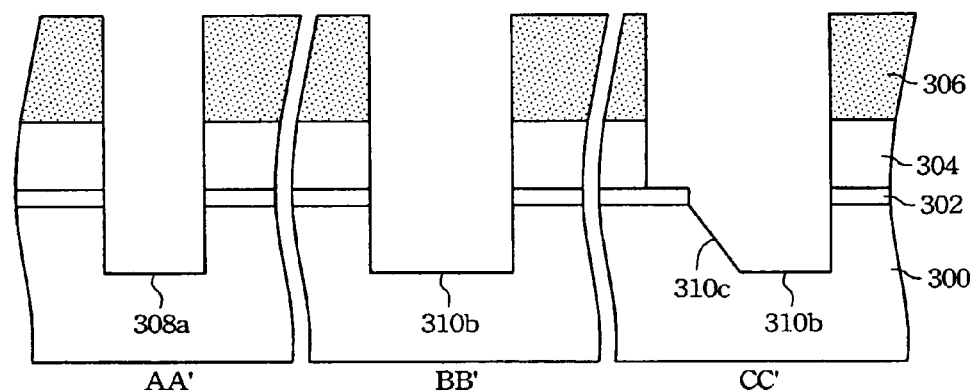
Figure 4A:
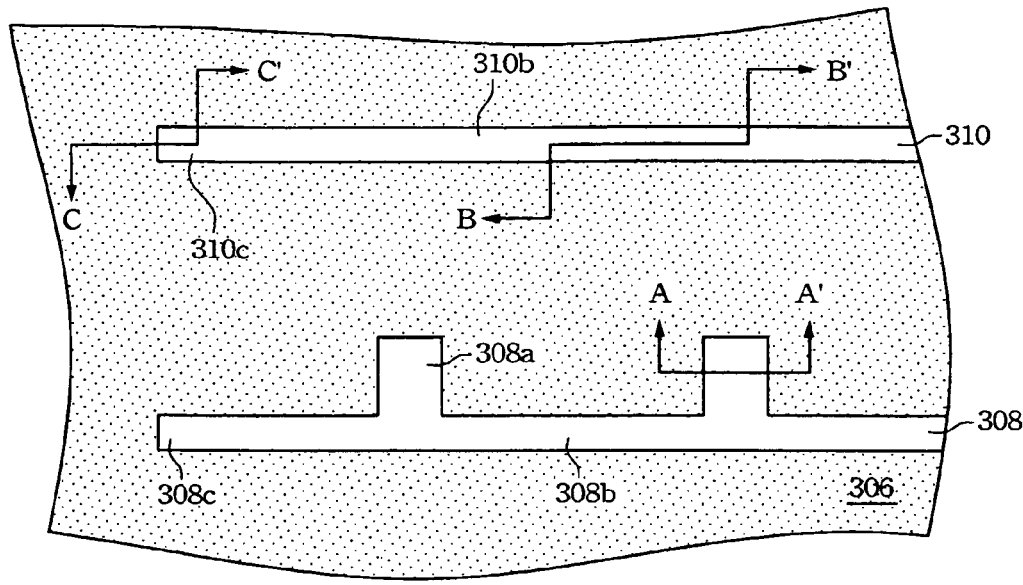
FIG. 4A is a plan view of FIG. 3B.
Figure 4B:
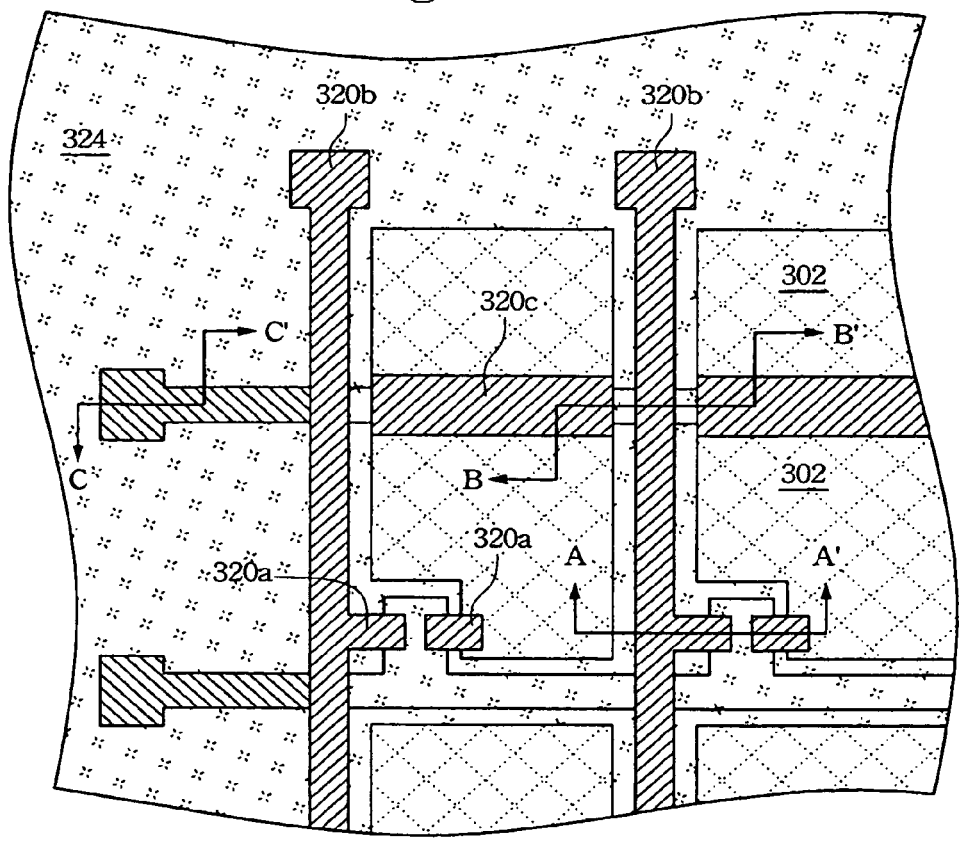
FIG. 4B is a plan view of FIG. 3G.

FIG. 4A is a plan view of FIG. 3B. The first photoresist layer 306 serves as an etching mask to sequentially etch the exposed sacrificial layer 304, the is transparent conductive layer 302 and the substrate 300 to form a scanning trench 308 and a capacitive trench 310. The scanning trench has at least one TFT area 308a (section A-A' in FIG. 3B), a scanning area 308b, and a terminal area 308c. The capacitive trench 310 has a capacitive area 310b (section B-B' in FIG. 3B), and a terminal area 310c (section C-C' in FIG. 3B). The depth of the terminal areas 308c and 310c of the scanning trench 308 and the capacitive trench 310 are gradually decreased toward the outer ends of the scanning trench 308 and the capacitive trench 310. That is, the profile of the terminal areas 308c and 310c consists with the profile of the first photoresist layer 306 in FIG. 3A. Since the structures formed in the terminal areas 308c and 310c are the same, the terminal areas 308c and 310c are not differentiated in the following descriptions.

Figure 3C:
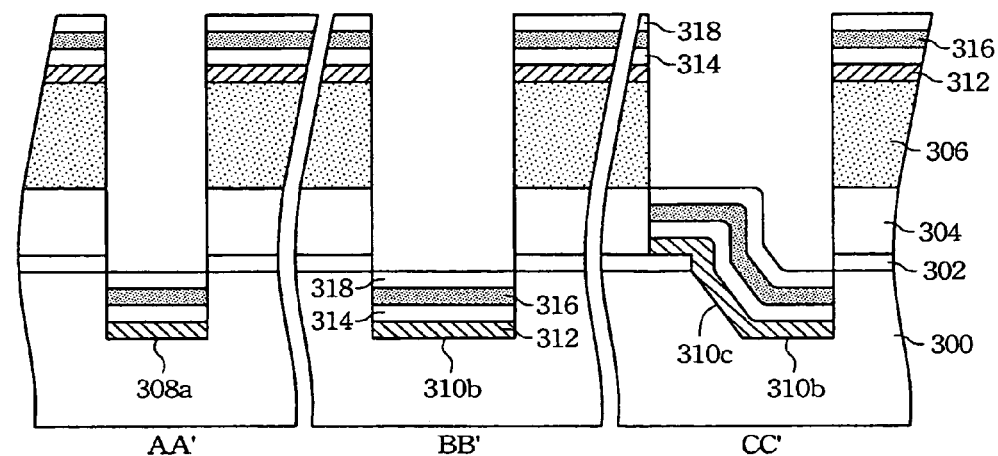

In FIG. 3C, a first metal layer 312, a dielectric layer 314, a silicon layer 316 (such as an amorphous silicon layer), and a doped silicon layer 318 (such as an doped amorphous silicon layer) area sequentially formed in the scanning trench 308 and the capacitive trench 310, and on the exposed transparent conductive layer 302 and the first photoresist layer 306. The material of the dielectric layer 314 is the same as that of the sacrificial layer 304.

In section C-C' of FIG. 3C, since the terminal area 310c slants toward the outer end to smoothly connect the bottom surface of the capacitive area 310b and the upper surface of the substrate 300, the first metal layer 312, the dielectric layer 314, the silicon layer 316 and the doped silicon layer 318 can continuously cover the capacitive area 310b, the terminal area 310c, and the substrate 300 without being limited by step coverage.

Figure 3D:
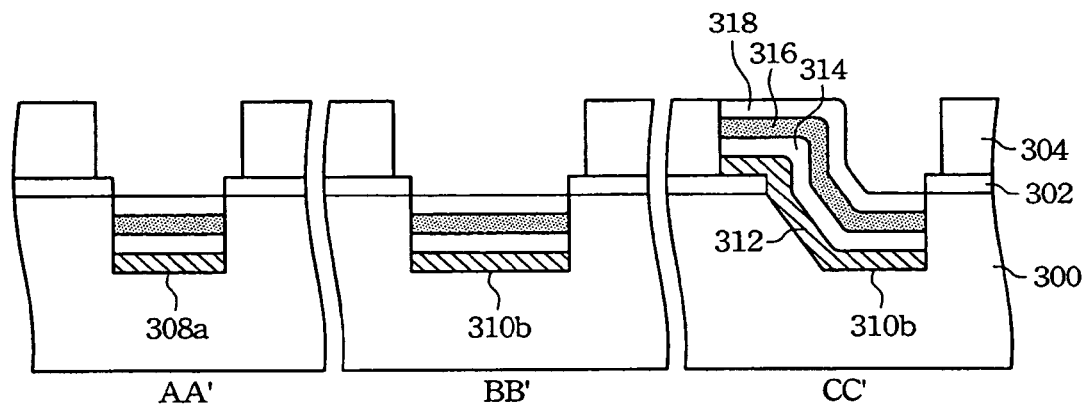

In FIG. 3D, the exposed sidewalls of the dielectric layer 314 and the sacrificial layer 304 are laterally etched to withdraw the lateral profile thereof. A proper solvent is then used to stripe the first photoresist layer 306 and layers thereon (i.e. the first metal layer 312, the dielectric layer 314, the silicon layer 316, and the doped silicon layer 318) to leave the structure in FIG. 3D.

The metal layer 312, the dielectric layer 314, and the silicon layer 316 in the TFT area 308a are respectively to be a gate, a gate dielectric layer, and a channel region of a thin film transistor. The first metal layer 312 in the capacitive trench 310b is to be both a bottom electrode of a storage capacitor and a capacitive line.

Figure 3E:
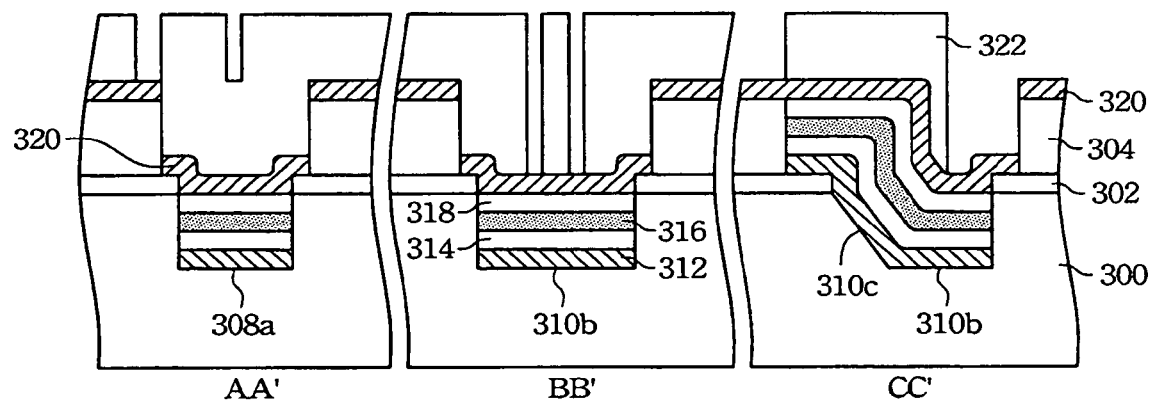

In FIG. 3E, a second metal layer 320 and a second photoresist layer 322 are sequentially formed on the sacrificial layer 304 and the exposed transparent conductive layer 302 and the doped silicon layer 318. Then a second photolithography process is performed to pattern the second photoresist layer 322 by, for example, a halftone photo mask.

On pixel area, source/drain area of the TFT area 308a, upper electrode areas of the storage capacitor, the data line area, and terminal areas, the second photoresist layer 322 are not exposed at all and hence remain intact. On channel area of the TFT area 308a, the second photoresist layer 322 is partially exposed to leave the second photoresist layer 322 having a reduced thickness. The second photoresist layer 322 on the pixel electrode areas except the area that the source/drain electrode connect to the upper electrode is fully exposed and hence is removed completely after the developing step.

Figure 3F:
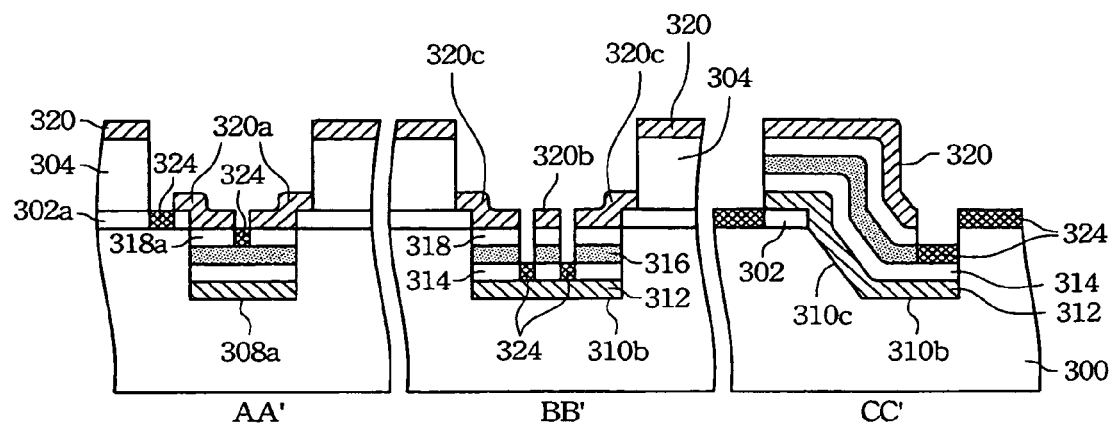

In FIG. 3F, an anisotropic etching process is performed to etch downwardly by using the second photoresist 322 as an etching mask. Since the thickness of the second photoresist layer 322 is varied on different areas, and the etch depth is hence varied on different areas.

In section A-A' of FIG. 3F, on the TFT area 308a covered by the second photoresist layer 322 with reduced thickness, the etching process is proceeded till the silicon layer 316 is exposed. The second metal layer 320 and the doped silicon layer 318 are simultaneously defined here to form source/drain 320a and underlying ohm contact layers 318a, respectively. On areas surrounding the TFT area 308a and not covered by the second photoresist layer 322, the second metal layer 320, the sacrificial layer 304, and the transparent conductive layer 302 are all removed to form a pixel electrode 302a from the transparent conductive layer 302.

In section B-B' of FIG. 3F, the exposed capacitive area 310b is etched till the first metal layer 312 is exposed. The second metal layer 320 is defined here to form a data line 320b and upper electrodes 320c of the storage capacitor.

In section C-C' of FIG. 3F, the exposed capacitive area 310b is etched till the dielectric layer 314 is exposed. The exposed area surrounding the terminal area 308c is etched till the substrate 300 is exposed.

Then, a protective layer 324 is formed on the exposed layers. The material of the protective layer 324 is, for example, a dielectric material such as silicon nitride, silicon oxide, or silicon oxynitride. The second photoresist layer 322 is striped and layers thereon are hence removed together to obtain the structure in FIG. 3F.

Figure 3G:
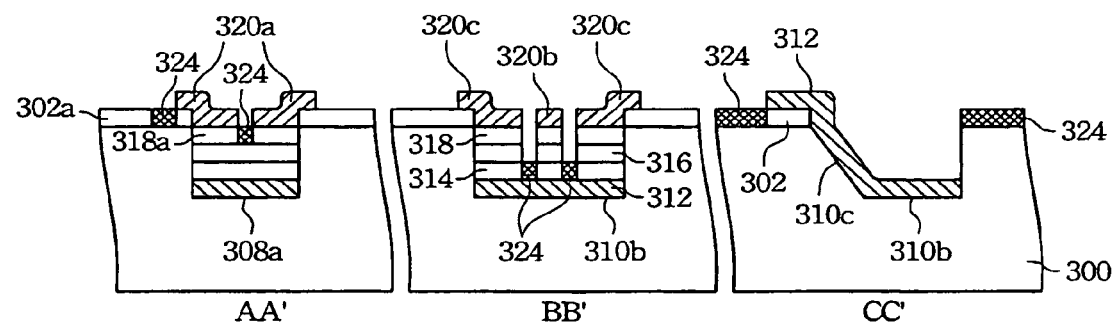

FIG. 3F is a plan view of FIG. 3G. Since the material of the sacrificial layer 304 and the dielectric layer 314 are the same; hence a proper etchant can be used to remove the sacrificial layer 304 and the dielectric layer 314 having is exposed sidewalls together. At the same time, layers on the sacrificial layer 304 and the dielectric layer 314 are removed together to obtain the structure of FIG. 3G and accomplish the TFT array process. The source/drains 320a electrically connect the pixel electrode 302a by a way of, for example, direct contact, as shown in FIG. 3G.

The protective layer 324 is used to protect the silicon layer 316 in the channel region and the dielectric layer 314 in the capacitive area 310b from being damaged by the etchant used to remove the sacrificial layer 304 and the dielectric layer 314.

In embodiment 2, a first photo mask is used to form the scanning trench and the capacitive trench in the transparent conductive layer and the substrate to predefine the pattern of the first metal layer. Moreover, the depth of the terminal area in the scanning trench and the capacitive trench is gradually decreased toward the outer end. Hence, the bonding pad on the terminal areas can be partially located on the substrate to facilitate wire bonding process. Next, laterally etching a portion of the sacrificial layer allows the second metal layer in the TFT area, the scanning area and the capacitive area and the first metal layer in the terminal area to connect with the transparent conductive layer. A second photo mask is then used to simultaneously define the pixel electrode, the source and drain, the upper electrode of the storage capacitor, and the data line. The source/drains electrically connect the pixel electrode by a way of, for example, direct contact. Hence, the whole TFT array process can be accomplished by using only two photo masks.

Embodiment 3

FIGS. 5A-5E are cross-sectional diagrams showing a process for fabricating an LCD TFT array plate according to another embodiment of this invention.

Figure 5A:
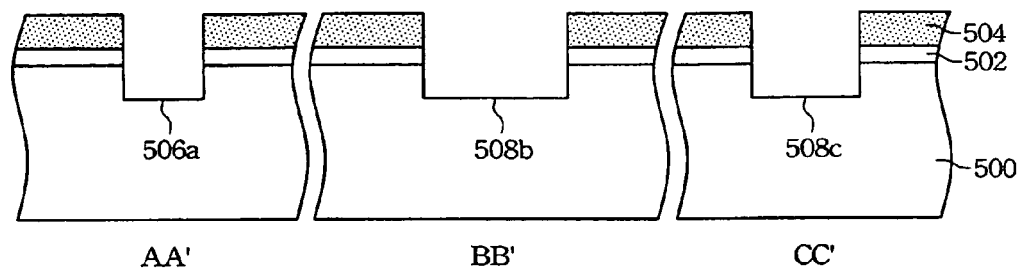
FIGS. 5A-5E are cross-sectional diagrams showing a process for fabricating a TFT array plate for use in an LCD, according to another embodiment of this invention.
Figure 6A:
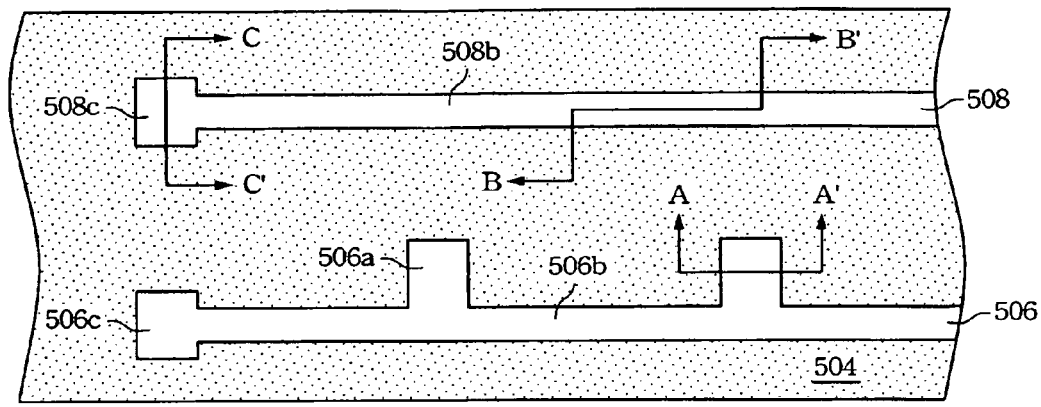
FIG. 6A is a plan view of FIG. 5A.

FIG. 6A is a plan view of FIG. 5A. A transparent conductive layer 502 and a first photoresist layer 504 are sequentially formed on a substrate 500. A first photo mask is used to perform a photolithography and etching process to form a scanning trench 500 and a capacitive trench 508. The surface of the substrate 500 outside the scanning trench 506 and the capacitive trench 508 is still sequentially covered by the transparent conductive layer 502 and the first photoresist 504. The substrate 500 is, for example, a glass substrate or a plastic substrate.

In FIG. 5A, the scanning trench 506 has three areas, a TFT area 506a (the section A-A' in FIG. 5A), a scanning area 506b, and a terminal area 506c. The capacitive trench 508 has two areas, a capacitive area 508b (section B-B' in FIG. 5A) and terminal area 508c (section C-C' in FIG. 5A). Since the structures formed in the terminal areas 506c and 508c are the same, the terminal areas 506c and 508c are not differentiated in the following descriptions.

Figure 5B:
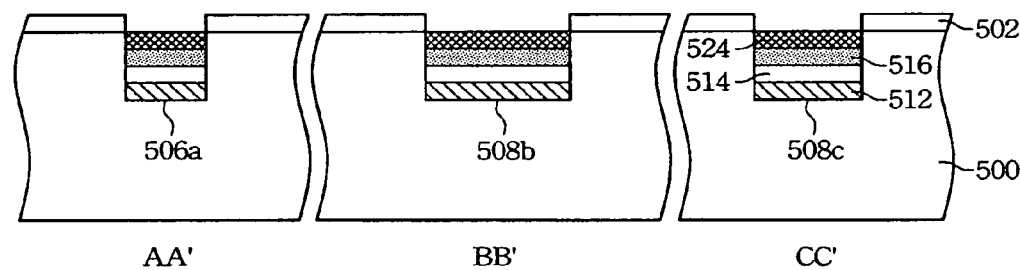

Referring to FIGS. 5B and 6A, a first metal layer 512, a dielectric layer 514, a silicon layer 516 (such as an amorphous silicon layer), and a protective layer 524 are sequentially deposited in the scanning trench 506, the capacitive trench 508 and on the first photoresist layer 504. Then, a proper solvent is used to stripe the first photoresist layer 504 and layers thereon, i.e. the first metal layer 512, the dielectric layer 514, the silicon layer 516, and the protective layer 524. Hence, only the first metal layer 512, the dielectric layer 514, the silicon layer 516, and the protective layer 524 in the scanning trench 506 and the capacitive trench 508 are remained. The material of the protective layer 524 can be, for example, silicon nitride, silicon oxide, or silicon oxynitride.

The first metal layer 512, the dielectric layer 514 and the silicon layer 516 in the TFT area 506a of the scanning trench 506 are to be a gate, a gate dielectric layer and a channel region of a thin film transistor (TFT), respectively. The first metal layer 512 in the capacitive area 508b of the capacitive trench 508 is served as both a capacitive line and a bottom electrode of a storage capacitor.

Figure 5C:
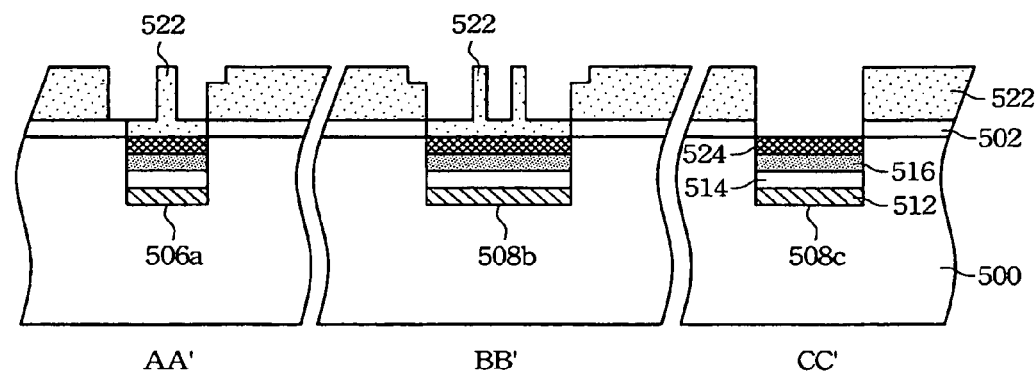

In FIG. 5C, a second photoresist layer 522 is formed on the substrate 500 and then patterned by a second photo mask to form the profile shown in FIG. 5C. On areas between the TFT area and the next pixel area as well as the terminal area 508c, the first photoresist layer 522 is fully exposed and hence no residual photoresist exist. On source/drain areas in TFT area 506a, and upper electrode and data line areas in the capacitive area 508b, the second photoresist layer 522 is less exposed, so a thin layer of the second photoresist 522 is thus left. On connect areas of the TFT area 506a and a pixel electrode, and connect areas of an upper electrode and the pixel electrode, the second photoresist 522 is least exposed, so a thicker layer of the second photoresist 522 is therefore left. On pixel areas, channel areas of the TFT areas 506a, spacing areas between the upper electrode areas and the data line areas, and areas surrounding the terminal areas 508c, the second photoresist layer 522 is not exposed at all and therefore remains intact on these areas.

Figure 5D:
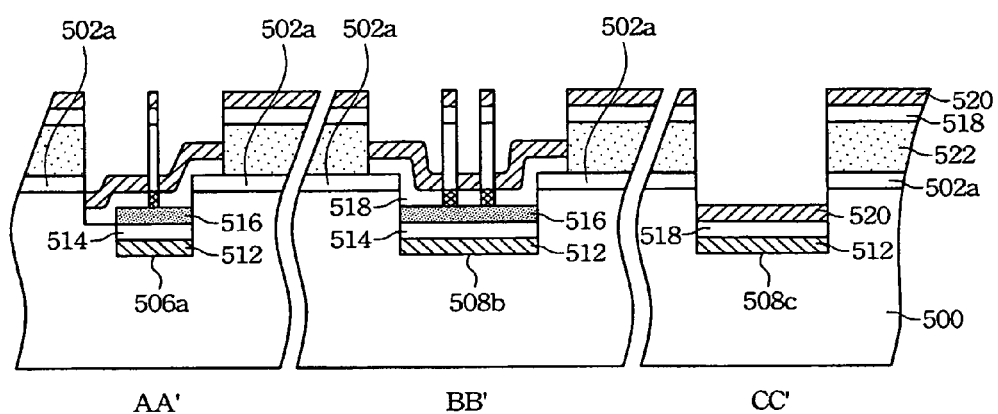

In FIG. 5D, an anisotropic etching process is performed to etch downwardly. Since the thickness of the second photoresist layer 522 is varied on different areas, and the etch depth is hence varied on different areas.

In section A-A' of FIG. 5D, on TFT area 506a covered by the second photoresist layer 522 with reduced thickness, the etching process is continued till the silicon layer 516 is exposed. On exposed areas surrounding the TFT area 506a, the transparent conductive layer 502 and a depth of substrate 500 are removed to predefine the transparent conductive layer 502 to form pixel electrodes 502a. On areas covered by the second photoresist layer 522 with reduced thickness and surrounding the TFT area 506a, the etching process is continued till the pixel electrode 502a is exposed to be a connect area of the TFT area 506a and the pixel electrode 502a.

In section B-B' of FIG. 5D, on the capacitive area 508b covered by the second photoresist layer 522 with reduced thickness, the etching process is continued till the silicon layer 516 is exposed. On areas surrounding the capacitive area 508b and covered by the second photoresist layer 522 with reduced thickness, the etching process is performed till the pixel electrode 502a is exposed to be connect areas of upper electrodes and the pixel electrodes 502a.

In section C-C' of FIG. 5D, on the exposed terminal area 508c, layers above the first metal layer 512 are all removed.

Then, a doped silicon layer 516 and a second metal layer 520 are sequentially formed on the exposed substrate 500, the silicon layer 516, the pixel electrode 502a and the second photoresist layer 522.

Figure 5E:
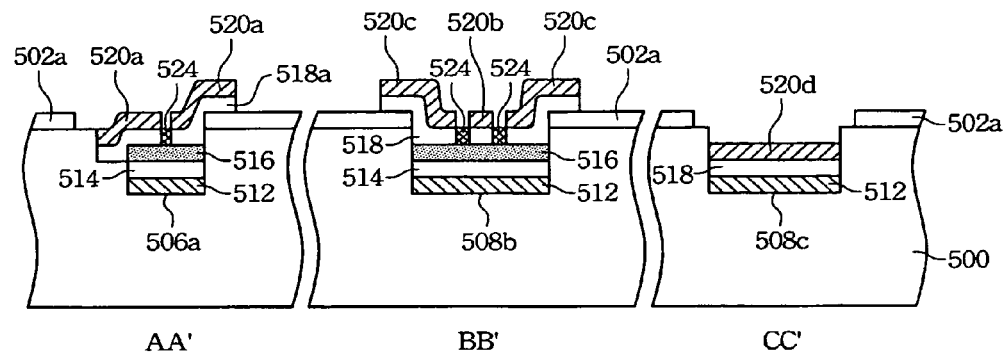
Figure 6B:
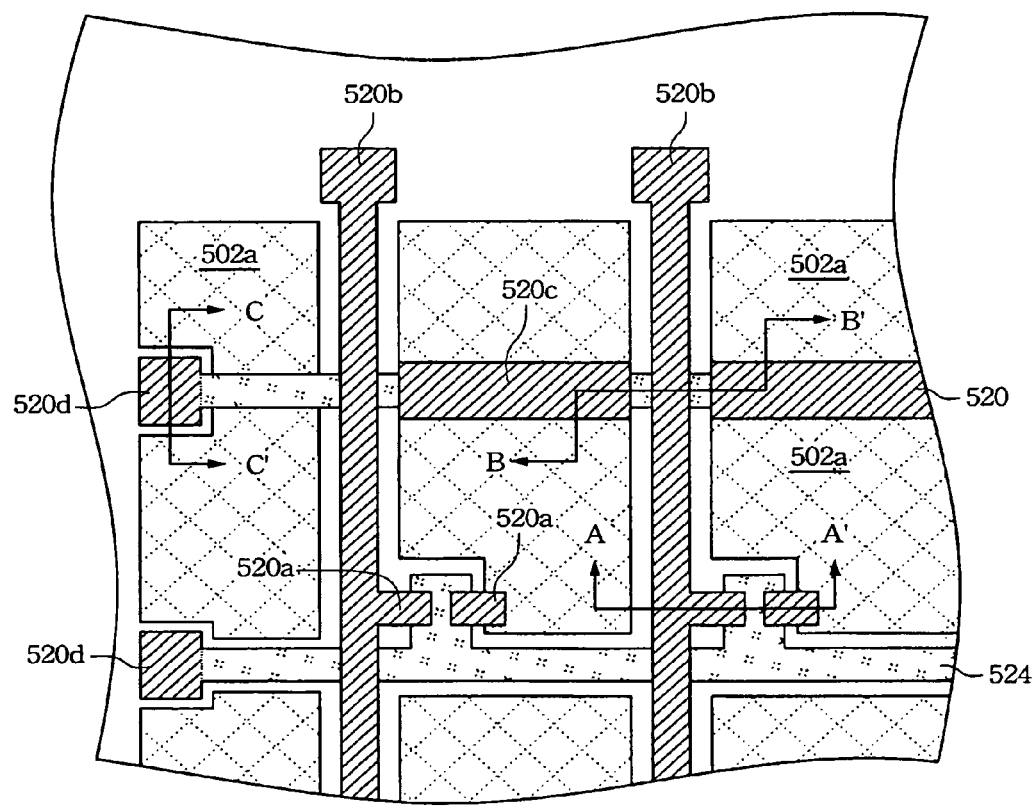
FIG. 6B is a plan view of FIG. 5B.

FIG. 6B is a plan view of FIG. 5E. The exposed sidewalls of the pixel electrodes 502a to draw back the lateral profile of the pixel electrodes 502a, and a possible short circuit problem between the pixel electrode 502a and the second metal layer 520 can be avoided. Next, the second photoresist layer 520 and layers thereon are stripped together to accomplish the whole TFT array process.

On TFT area 506a, the remained second metal layer 520 on TFT area 506a are used to be source/drain 520a, and the remained doped silicon layers 518 are used to be ohm contact layers 518a. On capacitive area 508b, the left second metal layers 520 are used to be data line 520b and upper electrodes 520c. On the terminal area 508c, the left second metal layer 520 is used to be a bonding pad. The source/drains 520a electrically connect the pixel electrode 502a through, for example, a ohm contact layer 518a, as shown in FIG. 5E.

In the embodiment 3, the first photolithography and etching processes are used to form the scanning trench and the capacitive trench in the transparent conductive layer and the substrate to predefine the TTF areas and the terminal areas related to the scanning line and the storage capacitor areas and the terminal areas related to the capacitive line. After depositing required material layers in the scanning trench and the capacitive trench, a second photolithography and etching process are used to remove the protective layers on areas of the source/drain of the TFT, the upper electrodes of the storage capacitors, data lines, and terminal areas. Then, the doped silicon layer and the second metal layers are then deposited on the areas described above to define the required structures, such as the source/drain of the TFT, the upper electrodes of the storage capacitors, and data lines. The source/drains electrically connect the pixel electrode through, for example, a ohm contact layer. Hence, only two photo masks are required to accomplish the whole TFT array process.

Accordingly, since the whole TFT array process can be accomplished by using only two photo masks, it is helpful to reduce cost and increase throughput.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a thin film transistor (TFT) array plate for use in a liquid crystal display, comprising:

forming a transparent conductive layer on a substrate;

forming a patterned photoresist on the transparent conductive layer;

patterning the transparent conductive layer and the substrate with the patterned photoresist to form at least one scanning trench and at least one capacitive trench arranged alternately in parallel, wherein the at least one scanning trench has at least one TFT area, at least one scanning area, and at least one first terminal area, and the at least one capacitive trench has at least one capacitive area and at least one second terminal area;

sequentially forming a first metal layer, a dielectric layer, a silicon layer, and a doped silicon layer only in the at least one scanning trench and the at least one capacitive trench, respectively;

removing the patterned photoresist;

forming a second metal layer on the doped silicon layer and the transparent conductive layer; and simultaneously defining a TFT in the TFT area, a storage capacitor and a data line in the capacitive area, and two terminal structures in the first and the second terminal areas by a photolithography and an etching process with a single exposure step.

2. The method of claim 1, wherein the step of sequentially forming the first metal layer, the dielectric layer, the silicon layer, and the doped silicon layer only in the at least one scanning trench and the at least one capacitive trench comprises:

simultaneously forming the first metal layer, the dielectric layer, the silicon layer, and the doped silicon layer in the at least one scanning trench and the at least one capacitive trench and on the pattered photoresist; and removing the pattered photoresist and the first metal layer, the dielectric layer, the silicon layer, and the doped silicon layer on the photoresist.

3. The method of claim 1, wherein the single exposure step uses a halftone photomask.

4. The method of claim 1, wherein the silicon layer comprises an amorphous silicon layer.

5. The method of claim 1, wherein the doped silicon layer comprises a doped amorphous silicon layer.

6. The method of claim 1, wherein the second metal layer electrically connects the transparent conductive layer.

7. The method of claim 6, wherein the second metal layer directly contact the transparent conductive layer.

8. The method of claim 1, wherein the substrate is a glass substrate or a plastic substrate.

* * * * *